United States Patent [19]
Lin

[11] Patent Number: 6,049,462
[45] Date of Patent: Apr. 11, 2000

[54] PC CARTRIDGE FOR COMPUTERS/GAME MACHINES

[76] Inventor: Anderson Lin, 2F, No. 9, Paohung Road, Hsin-Tien, Taipei Hsien, Taiwan

[21] Appl. No.: 08/921,029

[22] Filed: Aug. 29, 1997

[51] Int. Cl.[7] .............................. H05K 1/14; H05K 7/14
[52] U.S. Cl. ..................... 361/737; 361/728; 361/736; 361/752; 361/753; 361/759; 439/946
[58] Field of Search ..................................... 361/728, 736, 361/737, 740, 741, 752, 753, 759; 211/41.17; 235/492; 257/679; 439/946

[56] References Cited

U.S. PATENT DOCUMENTS

| | | | |
|---|---|---|---|
| 5,497,297 | 3/1996 | Kilmer et al. | 361/737 |
| 5,502,620 | 3/1996 | Funck et al. | 361/737 |
| 5,502,892 | 4/1996 | Lien | 361/737 X |
| 5,563,771 | 10/1996 | Bethurum | 361/737 |

*Primary Examiner*—Gerald Tolin
*Assistant Examiner*—Jayprakash N. Gandhi
*Attorney, Agent, or Firm*—Bacon & Thomas

[57] ABSTRACT

A PC cartridge for computers/game machines, including a bottom shell, an upper shell covered on the bottom shell, a PC board mounted within the bottom shell and the upper shell, and two connection ports connected to two opposite ends of the PC board, wherein the upper shell and bottom shell have a respective pair of locating flanges transversely disposed at two opposite ends and respectively forced into engagement with top and bottom locating grooves of the connection port; the bottom shell has two packing rubbers molded thereon along its two long sides and adapted to hold the connection ports therebetween; the upper shell has two downward front hooks respectively hooked in a respective front hook hole in the packing rubbers, two downward rear hooks respectively hooked in a respective rear mounting groove of the packing rubbers, and two L-shaped coupling flanges raised along its two long sides and respectively forced into engagement with the bottom edges of the packing rubbers.

2 Claims, 5 Drawing Sheets

PC CARTRIDGE FOR COMPUTERS/GAME MACHINES

BACKGROUND OF THE INVENTION

The present invention relates to a PC cartridge for computers/game machines, and more particularly to such a PC cartridge which is comprised of a bottom shell having two packing rubbers molded thereon, an upper shell covered on the bottom shell and secured to the packing rubbers by hooks and coupling flanges, two connection ports transversely connected between the packing rubbers at front and rear sides, and a PC board mounted within the upper shell and the bottom shell and connected between the connection ports.

Various PC cartridges have been developed for use with a notebook computer or game machine to provide a software program or game program. A regular PC cartridge is generally comprised of an upper shell and a bottom shell made from a respective metal sheet by stamping, a PC board with an IC or memory chip mounted within the upper shell and the bottom shell, and two connection ports transversely mounted within the upper shell and the bottom shell and respectively connected to two opposite ends of the PC board. FIG. 1 shows a PC cartridge constructed according to U.S. Pat. No. 5,339,222. This structure of PC cartridge comprises a metal bottom shell, a metal upper shell covered on the metal bottom shell, and a plastic packing elements molded on two opposite ends of one shell for securing the other shell in place. When the metal upper shell and the metal bottom shell are fastened together, a flat storage space is defined therebetween for holding a PC board and the related means. This structure of PC cartridge has drawbacks. Because the front and rear ends of the PC cartridge are not wrapped with packing means, the front and rear sides of the metal upper shell or metal bottom shell tend to be forced to deform, thereby causing openings to be formed at two opposite ends of the PC cartridge through which dust will pass to the inside of the PC cartridge to contaminate the internal circuit. Another drawback of this structure of PC cartridge is that the metal upper shell tends to displace relative to the metal bottom shell after the coupling flanges of the metal upper shell are forced into engagement with the plastic packing elements. Furthermore, when the PC cartridge does not pass the test after its fabrication, it is difficult to open the metal upper shell from the metal bottom shell for a repair work.

SUMMARY OF THE INVENTION

The present invention has been accomplished to provide a PC cartridge for computers/game machines which eliminates the aforesaid drawbacks. According to one aspect of the present invention, the PC cartridge comprises a bottom shell, an upper shell covered on the bottom shell, a PC board mounted within the bottom shell and the upper shell, and two connection ports connected to two opposite ends of the PC board, wherein the upper shell and bottom shell have a respective pair of locating flanges transversely disposed at two opposite ends and respectively forced into engagement with top and bottom locating grooves of the connection port; the bottom shell has two packing rubbers molded thereon along its two long sides and adapted to hold the connection ports therebetween; the upper shell has two downward front hooks respectively hooked in a respective front hook hole in the packing rubbers, two downward rear hooks respectively hooked in a respective rear mounting groove of the packing rubbers, and two L-shaped coupling flanges raised along its two long sides and respectively forced into engagement with the bottom edges of the packing rubbers. According to another aspect of the present invention, the locating flanges of the upper shell and bottom shell respectively slope in one direction at an angle within 15°. Because the locating flanges of the upper shell and bottom shell are respectively forced into engagement with the locating grooves of the connection ports, the two opposite ends of the PC cartridge are firmly secured in shape and sealed against dust. Further, when the front end of the upper shell is pulled upwards from the front end of the bottom shell, the front hooks of the front shell are disengaged from the front hook holes of the packing rubbers, and thus the upper shell can be conveniently detached from the bottom shell.

DETAILED DESCRIPTION OF THE PREFERRED EMBODIMENT

Figure 1:
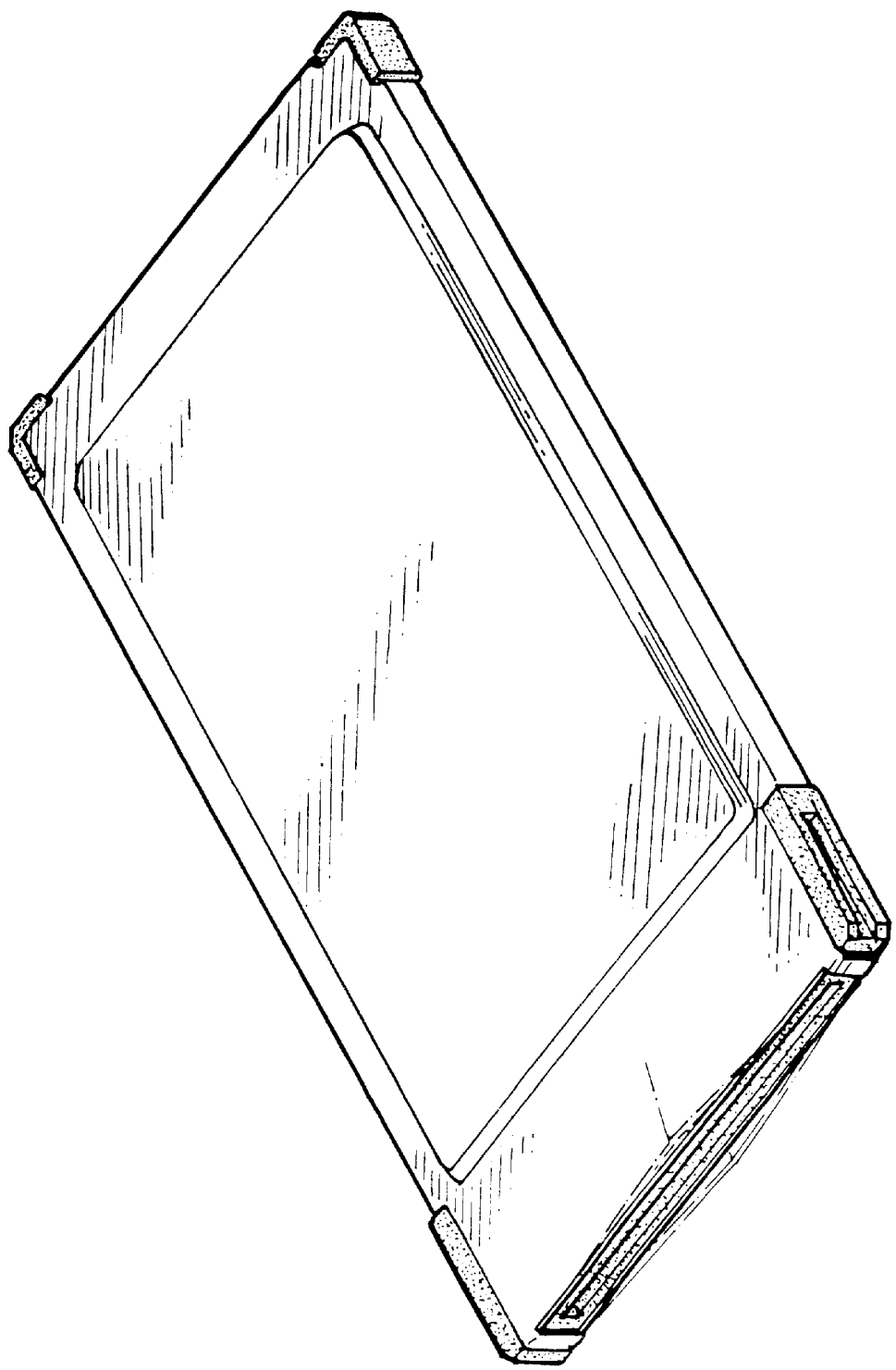
FIG. 1 shows a PC cartridge according to the prior art.
Figure 2:
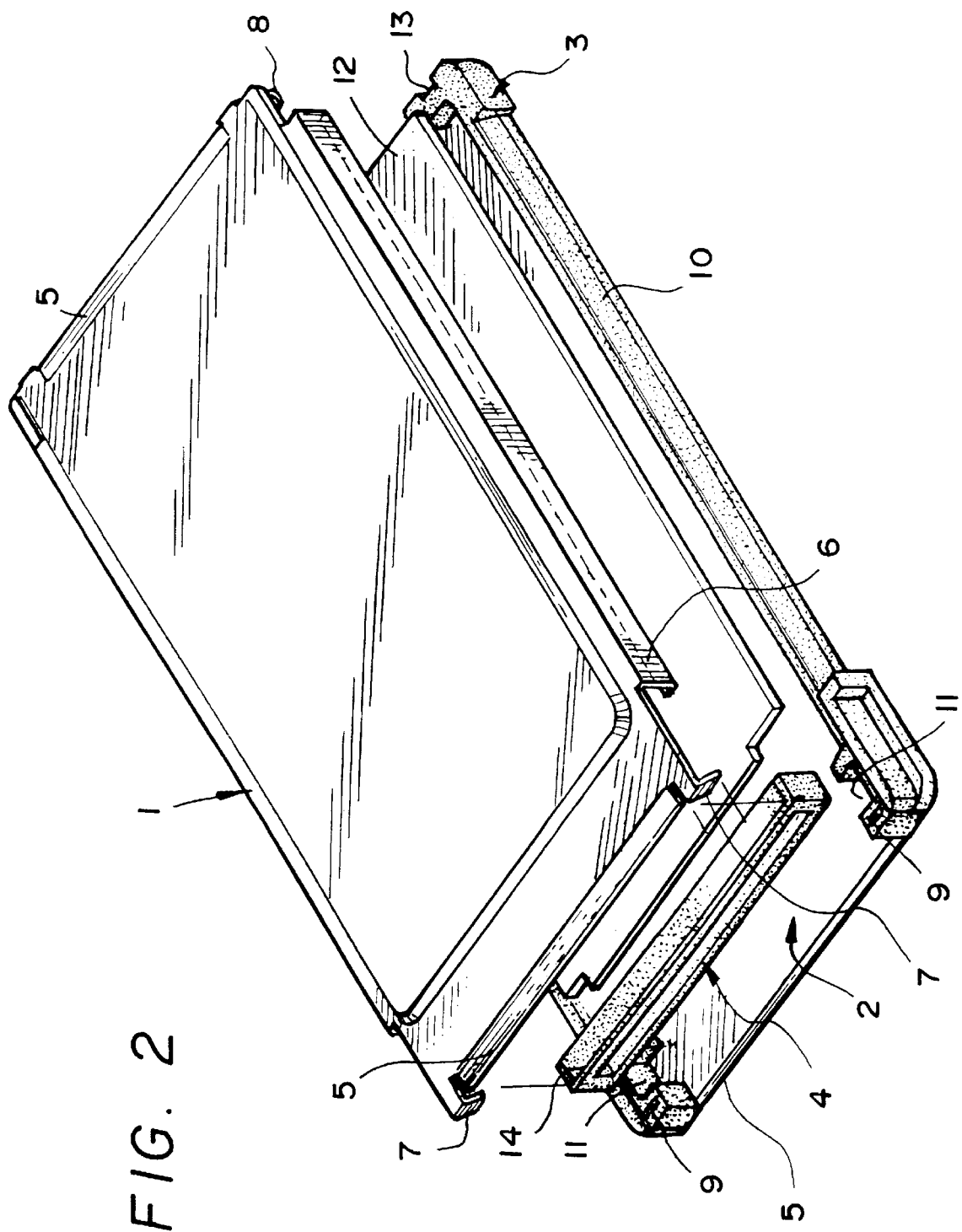
FIG. 2 is an exploded view of a PC cartridge according to the present invention.

Referring to FIG. 2, a PC cartridge in accordance with the present invention is generally comprised of a rectangular bottom shell 2, a rectangular upper shell 1 fitting over the rectangular bottom shell 2, two packing rubbers 3 molded on the bottom shell 2 along its two opposite long sides, a PC board 12 mounted within the upper shell 1 and the bottom shell 2, and two connection ports 4 transversely connected between the packing rubbers 3 and respectively connected to two opposite ends of the PC board 12.

Figure 3:
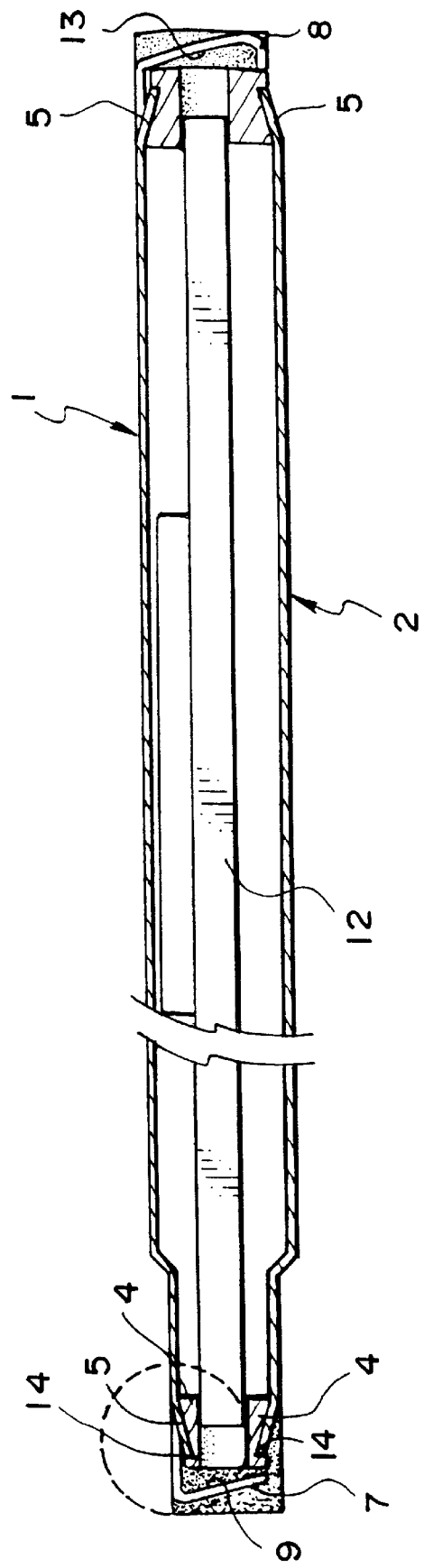
FIG. 3 is a transverse view in section of the PC cartridge according to the present invention.

Referring to FIG. 3 and FIG. 2 again, the upper shell 1 and bottom shell 2 are respectively made from metal, having a respective pair of locating flanges 5 transversely raised from the respective front and rear sides. The locating flanges 5 extended downwardly outwards from two opposite ends of the upper shell 1 or upwardly outwards from two opposite ends of the bottom shell 2. The sloping angle of the locating flanges 5 is preferably within 15° angle. The upper shell 1 further comprises front hooks 7 downwardly inwardly extended from two opposite ends of its front side, two rear hooks 8 downwardly outwardly extended from two opposite ends of its rear side, and two substantially L-shaped coupling flanges 6 respectively raised from its two opposite long sides. Each packing rubber 3 comprises a front hook hole 9 at its front end, a sloping mounting groove 13 at its rear end, two inward coupling holes 11 disposed near its two opposite ends, and a longitudinal coupling flange 10 disposed along one long side of the bottom shell 2. The longitudinal coupling flange 10 of each packing rubber 3 has an outer surface sloping downwardly outwards. Each connection port 14 has two locating grooves 14 at its top and bottom sides.

Figure 5:
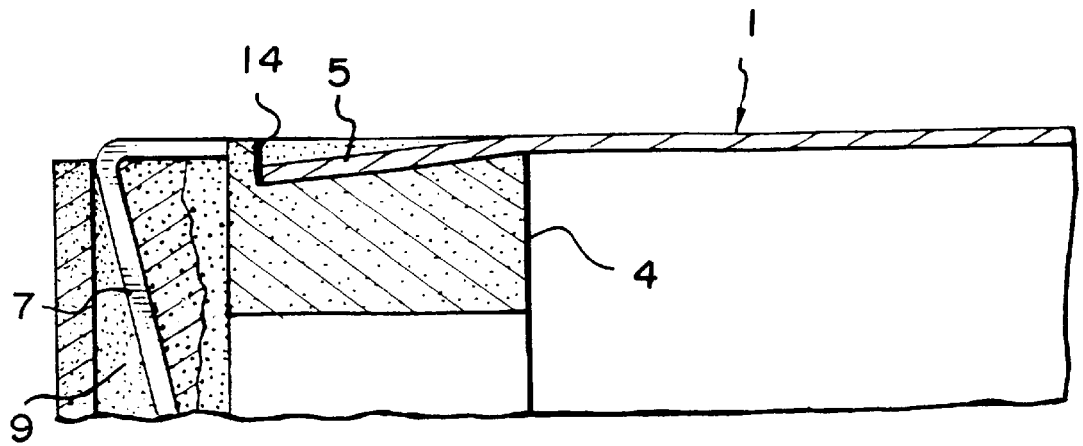
FIG. 5 is an enlarged view of a part of FIG. 3.

Referring to FIGS. from 4 to 6 and FIGS. 2 and 3 again, the upper shell 1 and the bottom shell 2 are fastened together by: hooking the front hooks 7 and rear hooks 8 of the upper shell 1 in the front hook holes 9 and sloping mounting grooves 13 of the packing rubbers 3 (see FIGS. 3 and 5), and forcing the L-shaped coupling flanges 6 of the upper shell 1 over the sloping outer surfaces of the packing rubbers 3 into engagement with the bottom edges of the packing rubbers 3

Figure 4:
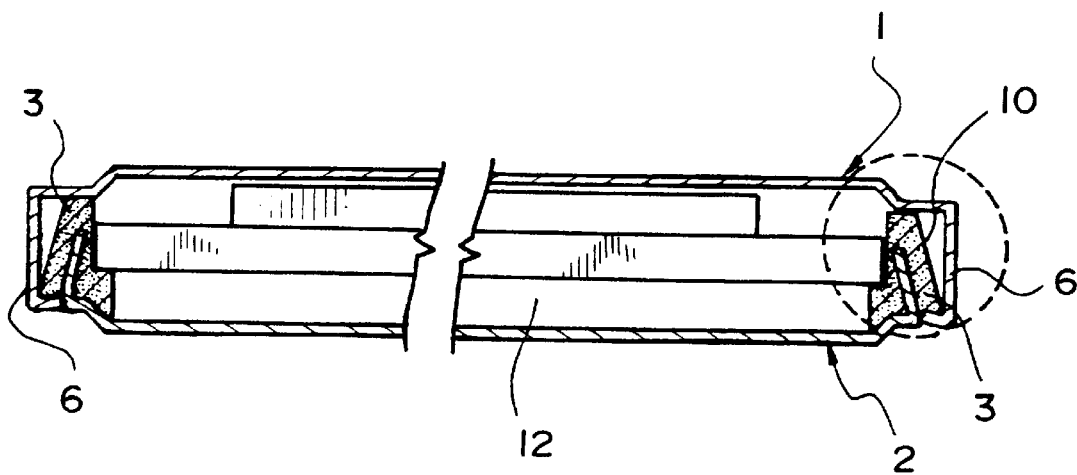
FIG. 4 is a longitudinal view in section of the PC cartridge according to the present invention.
Figure 6:
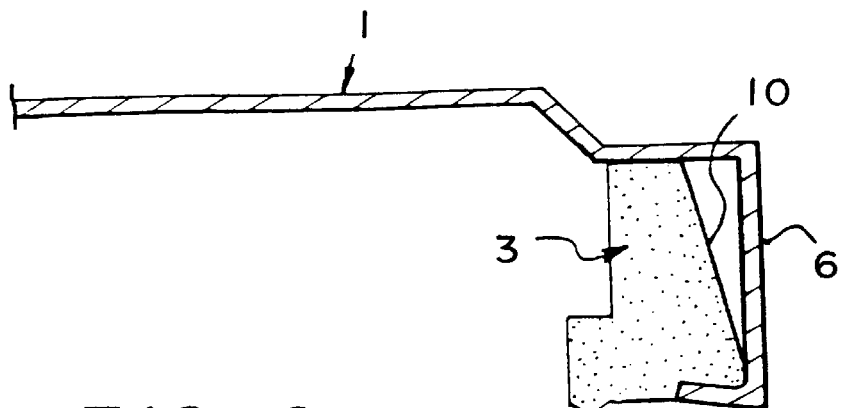
FIG. 6 is an enlarged view of a part of FIG. 4.

(see FIGS. 4 and 6). Before the upper shell 1 is covered on the bottom shell 2, the connection ports 4 are respectively mounted in the inward coupling holes 11 of the packing rubbers 3 and connected to two opposite ends of the PC board 12. When assembled, the locating flanges 5 of the upper shell 1 and bottom shell 2 are respectively forced into engagement with the locating grooves 14 of the connection ports 4 (see FIG. 5). Because the connection ports 4 are respectively retained between the locating flanges 5 of the upper shell 1 and bottom shell 2 and coupled to two opposite ends of the PC board 12, they are firmly secured in shape and will not be forced to deform. Furthermore, because the locating flanges 5 of the upper shell 1 and bottom shell 2 are forced into engagement with the locating grooves 14 of the connection ports 4, dust is prohibited from passing to the inside of the PC cartridge through the gap between the connection ports 4 and the upper shell 1 or bottom shell 2.

When to open the PC cartridge, the front end of the upper shell 1 is pulled upwards from the front end of the bottom shell 2 to disengage the front hooks 7 of the upper shell 1 from the front hook holes 9 of the packing rubbers 3.

While only one embodiment of the present invention has been shown and described, it will be understood that various modifications and changes could be made thereunto without departing from the spirit and scope of the invention disclosed.

What the invention claimed is:

1. A PC cartridge comprising a rectangular bottom shell, a rectangular upper shell covered on said rectangular bottom shell, a printed circuit board mounted within said rectangular bottom shell and said rectangular upper shell, and two connection ports transversely mounted within said rectangular bottom shell and said rectangular upper shell at front and rear sides of the PC cartridge and respectively connected to two opposite ends of said printed circuit board, wherein said connection ports have a respective bottom locating groove and a respective top locating groove; said bottom shell is made from metal, having two transverse locating flanges raised from front and rear sides thereof and respectively forced into engagement with the bottom locating grooves of said connection ports, and two packing rubbers molded on long sides thereof between its front and rear sides, each of said packing rubber comprising a front hook hole at one end, a sloping mounting groove at an opposite end, and a longitudinal coupling flange disposed along one long side of said bottom shell; said upper shell comprises two transverse locating flanges raised from front and rear sides thereof and respectively forced into engagement with the top locating grooves of said connection ports, two downward front hooks bilaterally raised front its front side and respectively hooked in the front hook holes of said packing rubbers, two downward rear hooks bilaterally raised from its rear side and respectively hooked in the sloping mounting grooves of said packing rubbers, and two L-shaped coupling flanges respectively raised from two opposite long sides thereof and forced into engagement with bottom edges of the longitudinal coupling flanges of said packing rubbers.

2. The PC cartridge of claim 1, wherein the locating flanges of said upper shell and said bottom shell respectively slope in one direction at an angle within 15°.

* * * * *